United States Patent [19]

Higuchi et al.

[11] Patent Number: 4,825,274
[45] Date of Patent: Apr. 25, 1989

[54] BI-CMOS SEMICONDUCTOR DEVICE IMMUNE TO LATCH-UP

[75] Inventors: Hisayuki Higuchi, Kokubunji; Makoto Suzuki, Hachioji, both of Japan

[73] Assignee: Hitachi, Ltd., Tokyo, Japan

[21] Appl. No.: 929,910

[22] Filed: Nov. 13, 1986

[30] Foreign Application Priority Data

Nov. 15, 1985 [JP] Japan .................. 60-254748

[51] Int. Cl.⁴ ........................................... H01L 27/02
[52] U.S. Cl. ...................... 357/43; 357/55; 357/86; 307/446
[58] Field of Search ............. 307/446, 200 A, 69; 357/38, 43, 41, 86, 42, 55

[56] References Cited

U.S. PATENT DOCUMENTS 4,628,341 12/1986 Thomas ................................ 357/43
4,661,723 4/1987 Masuda et al. ................... 307/446

FOREIGN PATENT DOCUMENTS 48-39175 6/1973 Japan .
59-8431 1/1984 Japan .

Primary Examiner—Joseph E. Clawson, Jr.
Attorney, Agent, or Firm—Antonelli, Terry & Wands

[57] ABSTRACT

A circuit including a Bi-CMOS semiconductor device of a structure capable of preventing the latch-up phenomenon from occurring when operated as an inverter or the like. The semiconductor device includes a MOS FET and a bipolar transistor merged with each other and having a PNPN or NPNP structure in a region to which minority carriers can migrate through diffusion and in which a same potential is applied to at least a pair of P-type and N-type regions or a backward voltage is applied across PN junctions in operation. The semiconductor device comprises electrodes provided in both P-type and N-type regions, respectively, which form one of the PN junctions, wherein a backward voltage not lower than 0.5 V is applied across the electrodes upon operating the device.

6 Claims, 4 Drawing Sheets

BI-CMOS SEMICONDUCTOR DEVICE IMMUNE TO LATCH-UP

BACKGROUND OF THE INVENTION

The present invention generally relates to a semiconductor device and more particularly to a semiconductor device suited for implementing a high-speed logic circuit of low power consumption with an increased packing density.

In hitherto known LSI devices, attempts have been made to decrease the device area by merging a bipolar transistor with an MOS FET in such a structure in which the base of the bipolar transistor is used commonly as the source or drain of the MOS FET, as disclosed, for example, in JP-A-No. 48-39175. With such merged or composite structure, the bipolar transistor and the MOS FET cooperates to form a PNPN device as a parasitic element. This PNPN device has a tendency to be turned on in dependence on the operating conditions to cause a so-called latch-up phenomenon to take place, which a problem in practical applications.

The present inventors have attempted to analytically understand the latch-up phenomenon by using a circuit composed of bipolar transistors and MOS FETs connected in such an arrangement as shown in FIGS. 1 and 2 of the accompanying drawings.

In this conjunction, it should be mentioned that the circuit configuration shown in FIG. 1 of the accompanying drawings is substantially the same as the one shown in FIG. 1 of JP-A-No. 59-8431 which was invented through cooperation of one of the present inventors with other persons except that a resistor 121 is present in the case of the circuit shown in FIG. 1 of the accompanying drawings. This resistor has an important relationship to the latch-up phenomenon, as will be elucidated below.

As the result of the analytical study conducted by the present inventors, it has been found that the portion in which the latch-up takes places in the circuit shown in FIG. 1 lies in a region covered by a bipolar transistor 110 and an FET 105. More specifically, it is assumed that a PNPN device (which corresponds to the one constituted by the layers 227, 225, 226 and 229 shown in FIG. 2) formed between the bipolar transistor 110 and the source region 227 of the FET 105 is turned on under certain conditions of operation. The PNPN device once turned on will continue to be in the conducting state. At that time, the current flowing through the PNPN device continues to increase until the current is limited by the resistor 121. In this state, the source region 227 of the FET 105 is constantly applied with a voltage in the forward direction relative to the collector 222 of the bipolar transistor 110. Under these conditions, no effective means is available to interrupt the conduction of the PNPN device except for decreasing the supply voltage to an extremely low level. This is the phenomenon referred to as the latch-up.

SUMMARY OF THE INVENTION

In view of the fact that when the potential at the source region of the FET 105 which is higher than that of the collector region of the bipolar transistor 110 it causes the occurrence of the latch-up phenomenon, the present inventors have made efforts to find a method of suppressing or preventing the potential at the source region of the FET from increasing beyond that of the collector region of the bipolar transistors. To this end, the following methods were tried by way of experiment.

(1) Decreasing the resistance value of the resistor 121.
(2) Applying previously to the source region of the FET 105 a potential lower than that of the collector region of the bipolar transistor 110.
(3) Applying a potential lowered through the resistor 121 to the source region of the FET 105.

The first method of decreasing the resistance value of the resistor 121 was tried in various manners. It has however been found that reduction of the resistance value is limited to a range of several ohms to several ten ohms, which means that significant improvement can not be expected.

The second method of applying previously the low potential region to the source of the FET is certainly effective to make the occurrence of the latch-up phenomenon difficult and is additionally accompanied with an advantage that the device area is not increased. However, this second method is disadvantageous in that once the latch-up occurs it can not be cleared. By the third method of applying the voltage lowered through the resistor 121 to the source region of the FET 105, the latch-up phenomenon could be positively prevented from taking place.

Accordingly, it is an object of the present invention to provide a semiconductor device which is immune to the latch-up phenomenon.

Another object of the invention is to provide a VLSI semiconductor device which can enjoy much stabilized operation.

These and other objects and many of the attendant advantages of the invention will be readily appreciated as the same becomes better understood by reference to the following detailed description when considered in connection with the accompanying drawings.

DESCRIPTION OF THE PREFERRED EMBODIMENTS

Now, the invention will be described in detail in conjunction with the exemplary embodiments thereof.

EXAMPLE 1

Figure 3:
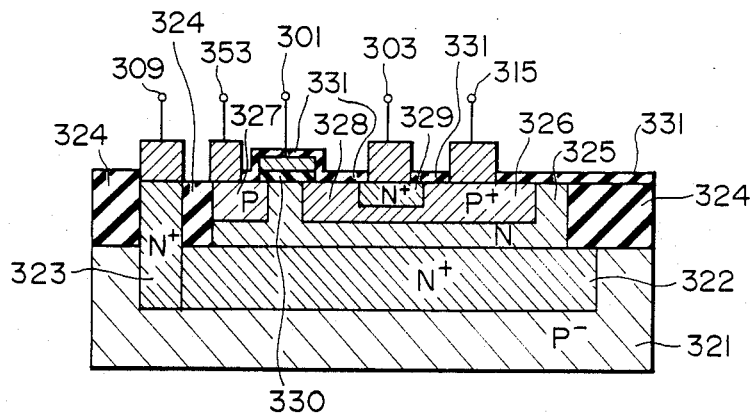
FIG. 3 is a sectional view showing a semiconductor device according to a first embodiment of the invention.

FIG. 3 is a sectional view showing a structure of a semiconductor device according to a first embodiment of the invention in which means are incorporated for preventing the latch-up phenomenon from occurrence. More specifically, FIG. 3 is a fragmental sectional view showing the regions of the elements 105 and 110 where the latch-up tends to take place, as described hereinbefore by referring to FIG. 1. (The same applies to the structures shown in FIGS. 4 and 6.) Turning to FIG. 3, a terminal 353 for the source region 327 of a P-type MOS FET is separated from a terminal 309 for the collector region 322 of a bipolar transistor, wherein the terminal 353 for the source region of the MOS FET is supplied with a potential of such a level which makes it difficult for the latch-up phenomenon to take place. Such potential level can be experimentally determined by measuring previously the conditions under which the latch-up can occur.

The illustrated device was manufactured by preparing a P-type silicon substrate 321 of low impurity concentration, and an N-type buried layer (collector region) 322 was formed by doping with an impurity such as Sb or As at a high concentration. Subsequently, an epitaxially grown N-type layer 325 of low impurity concentration was formed over the whole surface of the substrate. Next, an isolation film 324 for isolating the elements from one another was formed or grown by thermal oxidation. The inter-element isolation film 324 may be formed by a so-called LOCOS (Local Oxidation of Silicon) method. Next, a gate insulation film 330 of the MOS transistor was formed through a thermal oxidation process, being followed by deposition of polycrystalline silicon or the like on the gate insulation film, to thereby form a gate electrode of a desired shape by photolithography. Subsequently, a P-type source region 327 add, a P-type drain region 328 (a P-type base region 326) were formed in self alignment with the gate electrode by an ion implantation method. Finally, a passivation layer 331 was deposited over the whole surface, being followed by forming of electrode lead-out holes through photolithography. The holes were filled with an electrically conductive material such as aluminum. Through an appropriate finishing process, electrodes 303, 309, 315 and 353 of desired configuration were formed.

With the structure described above, it has been found that the latch-up phenomenon does not take place under the normal operating conditions so long as the potential at the terminal 353 is lower than that of the terminal 309 by 0.5 V or more. However, when the potential at the terminal 309 is further increased to such a level at which the breakdown occurs across the PN junction, the latch-up phenomenon is likely to take place, making it difficult to restore the normal operation of the device, which is a problem.

EXAMPLE 2

Figure 4:
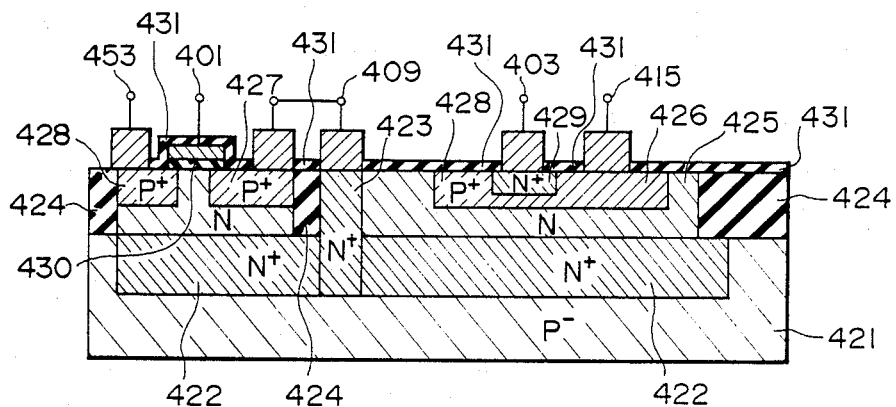
FIG. 4 is a sectional view showing a second embodiment of the invention.

FIG. 4 is a sectional view of the semiconductor device of a structure in which the problem of the device shown in FIG. 3 is alleviated. In the case of the instant exemplary embodiment, a buried layer 422 is formed on the P-type substrate 421, and an epitaxially grown layer 425 constitutes the collector region of a bipolar transistor and at the same time serves as the substrate for an MOS transistor. A base region 426, an emitter region 429, a source region 427 and a drain region 428 are formed in the epitaxial layer 425. A gate insulation film 430, a passivation film 431 and electrodes 403, 409, 415 and 453 are provided in a similar manner as in the case of the device shown in FIG. 3. In conjunction with the device structure shown in FIG. 4, it should be noted that the position of the source region 427 of the FET relative to the terminal 409 for the collector region 422 (425) of the transistor is reversed when compared with the device shown in FIG. 3. With this arrangement, the influence of the voltage drop across the collector resistance of the transistor is mitigated, as the result of which the potential at the source region of the FET is more positively prevented from becoming higher than the potential at the collector region 422 (425) of the transistor, whereby occurrence of the latch-up phenomenon can be suppressed more effectively.

Figure 2:
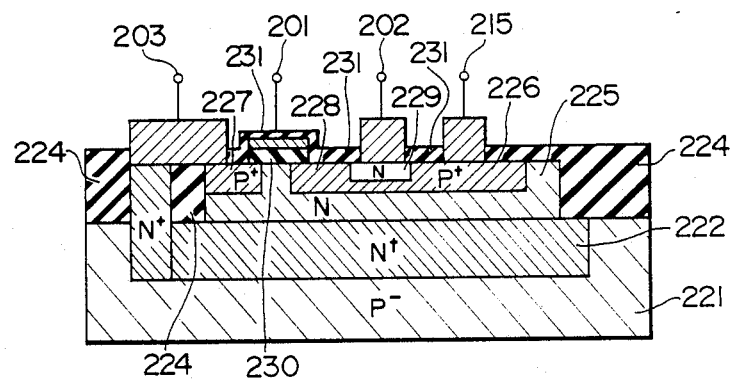
FIG. 2 is a sectional view showing a portion of a structure of the circuit shown in FIG. 1.
Figure 5:
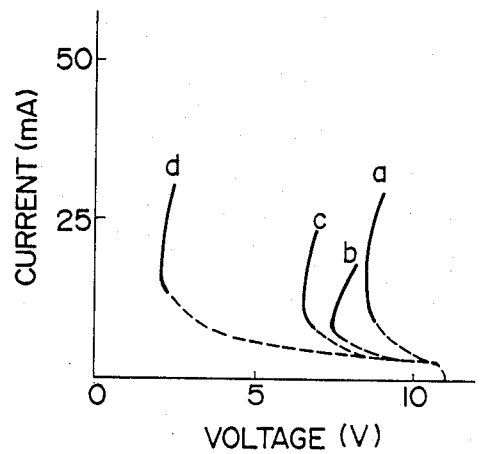
FIG. 5 is a view graphically illustrating voltage-current characteristics of three exemplary embodiments of the invention comparatively with that of a conventional device.

FIG. 5 graphically illustrates the voltage at which the latch-up may take place in the device structure shown in FIG. 4 comparatively with that of the conventional device. In FIG. 5, a curve a represents the voltage - current characteristic of a single transistor, while curves d and c represent the voltage - current characteristics of the devices shown in FIGS. 2 and 4, respectively. As will be seen from FIG. 5, the latch-up phenomenon does not take place at all in the voltage range lower than the breakdown voltage in the case of the structure shown in FIG. 4. Further, it has been found that even when a phenomenon similar to the latch-up is forcibly produced by applying a high voltage, the pseudo-latch-up phenomenon disappears at the maximum rated operation voltage of 6 V.

EXAMPLE 3

Figure 6:
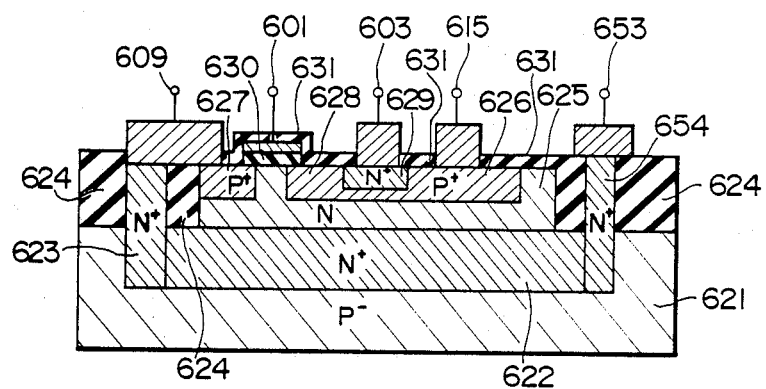
FIG. 6 is a sectional view showing a third embodiment of the invention.

FIG. 6 is a sectional view of a structure of the semiconductor device which is more effective in suppressing the occurrence of the latch-up than the devices shown in FIGS. 3 and 4. Referring to FIG. 6, a terminal 653 for the collector region 622 of a transistor is separated from a terminal 609 for the source region 627 of the FET. Additionally, a region 623 is formed in the collector region 622 in connection with the terminal 609 so that the potential at the collector region 622 which is made lower than the potential of the terminal 653 due to the voltage drop as produced is applied to the source region 627 of the FET. With this structure, the potential at the source region of the FET is necessarily lower than that of the collector region 622 to prevent the latch-up from occurring without fail. In reality, no latch-up phenomenon occurred at all in the actually fabricated device of the structure shown in FIG. 6. Even when the excessively large current flows upon application of a voltage higher than the breakdown voltage of the PN junction, the current flow disappears when the applied voltage is lowered to the rated voltage. The voltage - current characteristic of this device is represented by a curve b shown in FIG. 5.

EXAMPLE 4

Figure 7:
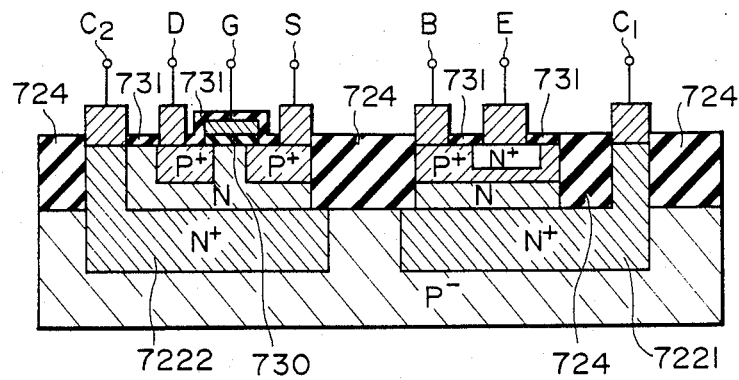
FIG. 7 is a sectional view showing a fourth embodiment of the invention.

FIG. 7 shows a semiconductor device according to a further embodiment of the invention which differs from the structure shown in FIG. 3 in that a buried layer 7222 of an MOS transistor and a buried layer 7221 of a bipolar transistor are separated from each other. With this structure, the possibility of the latch-up taking place is further reduced. The source electrode of the MOS transistor is supplied with a voltage which is lower than that of the collector electrode of the bipolar transistor. With this arrangement, the bipolar transistor can be positively prevented from being saturated.

EXAMPLE 5

Figure 8:
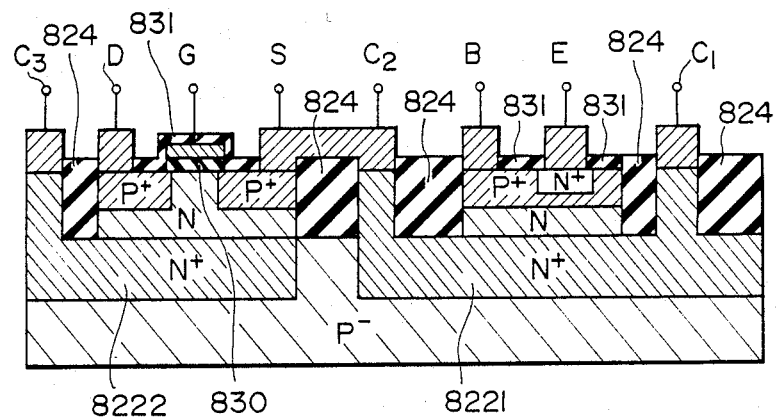
FIG. 8 is a sectional view showing a fifth embodiment of the invention.

FIG. 8 shows a semiconductor device according to still another embodiment of the invention which differs from the structure shown in FIG. 6 in that the buried layer 8222 of the MOS transistor and the buried layer 8221 of the bipolar transistor are provided separately from each other. With this structure, the latch-up phenomenon is more unlikely to occur. Further, since the source electrode of the MOS transistor is supplied with voltage by way of the buried layer 8221 of the bipolar transistor, the voltage applied to the source electrode is lowered due to the resistance of the buried layer, whereby the bipolar transistor is positively prevented from becoming saturated.

As will now be appreciated from the foregoing description, the unwanted latch-up phenomenon can be satisfactorily suppressed in the merged device in which the base region of bipolar transistor is used in common as the source or drain region of MOS FET according to the teachings of the invention. Also, the device area can be reduced as much as about 20% in the case of the circuit shown in FIG. 1. Additionally, the parasitic capacitance of the FET is also reduced, whereby the time lag of the circuit can be decreased about 10% when compared with the conventional non-merged device structure. Further, in the case of the devices of the structures shown in FIGS. 6 to 8, an advantageous effect is achieved that the saturation of the bipolar transistor can be effectively suppressed even when an excessively large current flows to lower the potential than the base potential due to the collector resistance, because then a backward current will flow through the MOS FET to raise the base potential.

Figure 1:
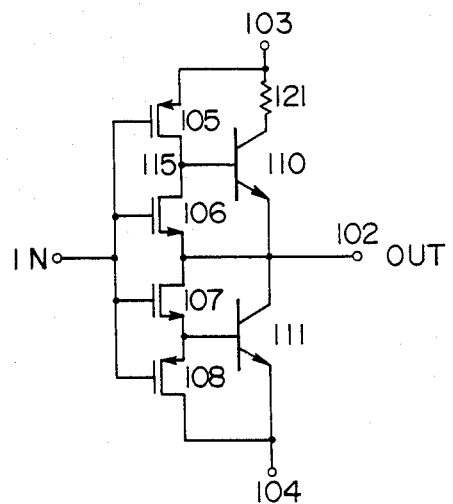
FIG. 1 is a view showing a circuit employed in the course of analysis of the latch-up phenomenon conducted by the present inventors.

A structure which is shown in FIGS. 7 or 8 but different in that the P-type MOS FET is changed to an N-type MOS FET, can be used to form the circuit of FIG. 1 as the FET 107 and the bipolar transistor 111 to achieve a similar effect to the Example 4 or 5.

It is further understood by those skilled in the art that the foregoing description are directed to preferred embodiments of the disclosed device and that various changes and modifications may be made in the invention without departing from the spirit and scope thereof.

We claim:

1. A semiconductor device including a combination circuit of a bipolar transistor and a MOSFET; wherein said MOSFET includes a gate which responds to an input signal, a source region, a drain region, and a source-drain path; said bipolar transistor includes a collector region connected at one end to a first terminal and at a second end to the source-drain path, a base region connected to the source-drain path, and an emitter region connected to a second terminal, wherein the emitter region, base region and collector region of said bipolar transistor and the source region and drain region of said MOSFET are formed within a semiconductor material.

2. A semiconductor device according to claim 1, wherein said bipolar transistor is an NPN-type bipolar transistor.

3. A semiconductor device according to claim 2, wherein said MOSFET is a P-channel type MOSFET.

4. A semiconductor device including a combination circuit of a bipolar transistor and a MOSFET; wherein said MOSFET includes a gate which responds to an input signal, a source region, a drain region, and a source-drain path; said bipolar transistor includes a collector region connected at one end to a first terminal and at a second end to the source-drain path, a base region connected to the source-drain path, and an emitter region connected to a second terminal, wherein the emitter region, base region and collector region of said bipolar transistor are formed within a first region of a semiconductor material, and the source region and drain region of said MOSFET are formed within a second region of said semiconductor material.

5. A semiconductor device according to claim 4, wherein said bipolar transistor is an NPN-type bipolar transistor.

6. A semiconductor device according to claim 5, wherein said MOSFET is a P-channel type MOSFET.

* * * * *